United States Patent [19]

Kinugasa et al.

[11] Patent Number: 5,122,869
[45] Date of Patent: Jun. 16, 1992

[54] VIDEO SIGNAL PROCESSING APPARATUS

[75] Inventors: Norihide Kinugasa, Itami; Hikaru Masui, Ashiya; Yoshimitsu Saka, Osaka; Koichi Yoshimura, Kyoto; Toshiaki Ioi; Narutoshi Kanazawa, both of Osaka, all of Japan

[73] Assignee: Matsushita Electric Industiral Co., Ltd., Japan

[21] Appl. No.: 623,827

[22] Filed: Dec. 7, 1990

[30] Foreign Application Priority Data

Dec. 20, 1989 [JP] Japan .................. 1-330513

[51] Int. Cl.⁵ ............................... H04N 9/83
[52] U.S. Cl. ........................ 358/40; 358/17; 358/310
[58] Field of Search ............ 358/23, 17, 19, 40, 358/310

[56] References Cited

U.S. PATENT DOCUMENTS 4,607,292 8/1986 Kojima et al. .................. 358/310
4,884,151 11/1989 Ohtsu et al. .................... 358/310

Primary Examiner—John W. Shepperd
Assistant Examiner—Minsun Oh
Attorney, Agent, or Firm—Lowe, Price, LeBlanc & Becker

[57] ABSTRACT

A video signal processing apparatus has a phase-locked loop which includes a quartz resonator, a voltage-controlled oscillator connected to the quartz resonator and oscillating at an oscillation frequency whose fundamental value is determined by the quartz resonator, and a horizontal sync signal lock circuit comparing a phase of a horizontal sync signal and a phase of an output signal from the voltage-controlled oscillator and controlling the oscillation frequency of the voltage-controlled oscillator in response to a difference between the phases of the horizontal sync signal and the output signal from the voltage-controlled oscillator. The video signal processing apparatus also has a device for modulating a video signal by use of the output signal from the voltage-controlled oscillator.

20 Claims, 9 Drawing Sheets

VIDEO SIGNAL PROCESSING APPARATUS

BACKGROUND OF THE INVENTION

This invention relates to a video signal processing apparatus usable in various equipments such as a video camera or a video cassette tape recorder (VCR). This invention also relates to a phase lock circuit usable in the video signal processing apparatus.

Portable or hand-held appliances including a combination of a video camera and a VCR are generally called "movies". As will be explained later, a prior art video signal processing apparatus used in a movie has some problems.

SUMMARY OF THE INVENTION

It is an object of this invention to provide an improved video signal processing apparatus.

It is another object of this invention to provide an improved phase lock circuit.

A first aspect of this invention provides a video signal processing apparatus comprising a phase-locked loop including a quartz resonator, a voltage-controlled oscillator connected to the quartz resonator and oscillating at an oscillation frequency whose fundamental value is determined by the quartz resonator, and a horizontal sync signal lock circuit comparing a phase of a horizontal sync signal and a phase of an output signal from the voltage-controlled oscillator and controlling the oscillation frequency of the voltage-controlled oscillator in response to a difference between the phases of the horizontal sync signal and the output signal from the voltage-controlled oscillator; and means for modulating the output signal from the voltage-controlled oscillator with a video signal; wherein the modulating means comprises an encoder balanced-modulating the output signal from the voltage-controlled oscillator with a color difference signal of the video signal; means for generating a frequency-multiple signal which agrees with a frequency-multiple of the horizontal sync signal; a sub balanced modulator balanced-modulating the frequency-multiple signal with the output signal from the voltage-controlled oscillator; and a main balanced modulator balanced-modulating an output signal from the sub balanced modulator with an output signal from the encoder.

A second aspect of this invention provides an apparatus comprising a voltage-controlled oscillator; a clock thinning circuit thinning out predetermined clock pulses from an output signal of the voltage-controlled oscillator; a 1/1135 frequency divider dividing a frequency of an output signal from the clock thinning circuit by 1135; a ¼ frequency divider dividing a frequency of a horizontal sync signal by 4; and means for comparing a phase of an output signal from the 1/1135 frequency divider and a phase of an output signal from the ¼ frequency divider, and for controlling an oscillation frequency of the voltage-controlled oscillator in response to a difference between the phases of the output signals from the 1/1135 frequency divider and the ¼ frequency divider.

A third aspect of this invention provides an apparatus comprising a voltage-controlled oscillator; a 1/910 frequency divider dividing a frequency of an output signal from the voltage-controlled oscillator by 910; a ¼ frequency divider dividing a frequency of a horizontal sync signal by 4; and means for comparing a phase of an output signal from the 1/910 frequency divider and a phase of an output signal from the ¼ frequency divider, and for controlling an oscillation frequency of the voltage-controlled oscillator in response to a difference between the phases of the output signals from the 1/910 frequency divider and the ¼ frequency divider.

A fourth aspect of this invention provides an apparatus comprising a voltage-controlled oscillator; a 1/455 frequency divider dividing a frequency of an output signal from the voltage-controlled oscillator by 455; a ½ frequency divider dividing a frequency of a horizontal sync signal by 4; and means for comparing a phase of an output signal from the 1/455 frequency divider and a phase of an output signal from the ½ frequency divider, and for controlling an oscillation frequency of the voltage-controlled oscillator in response to a difference between the phases of the output signals from the 1/455 frequency divider and the ½ frequency divider.

A fifth aspect of this invention provides a video signal processing apparatus comprising means for generating a subcarrier signal; a modulator modulating the subcarrier signal with a video signal; means for generating a fixed-frequency signal; a first mixer mixing the subcarrier signal and the fixed-frequency signal; a second mixer mixing an output signal from the modulator and an output signal from the first mixer.

DESCRIPTION OF THE PRIOR ART

Figure 9:
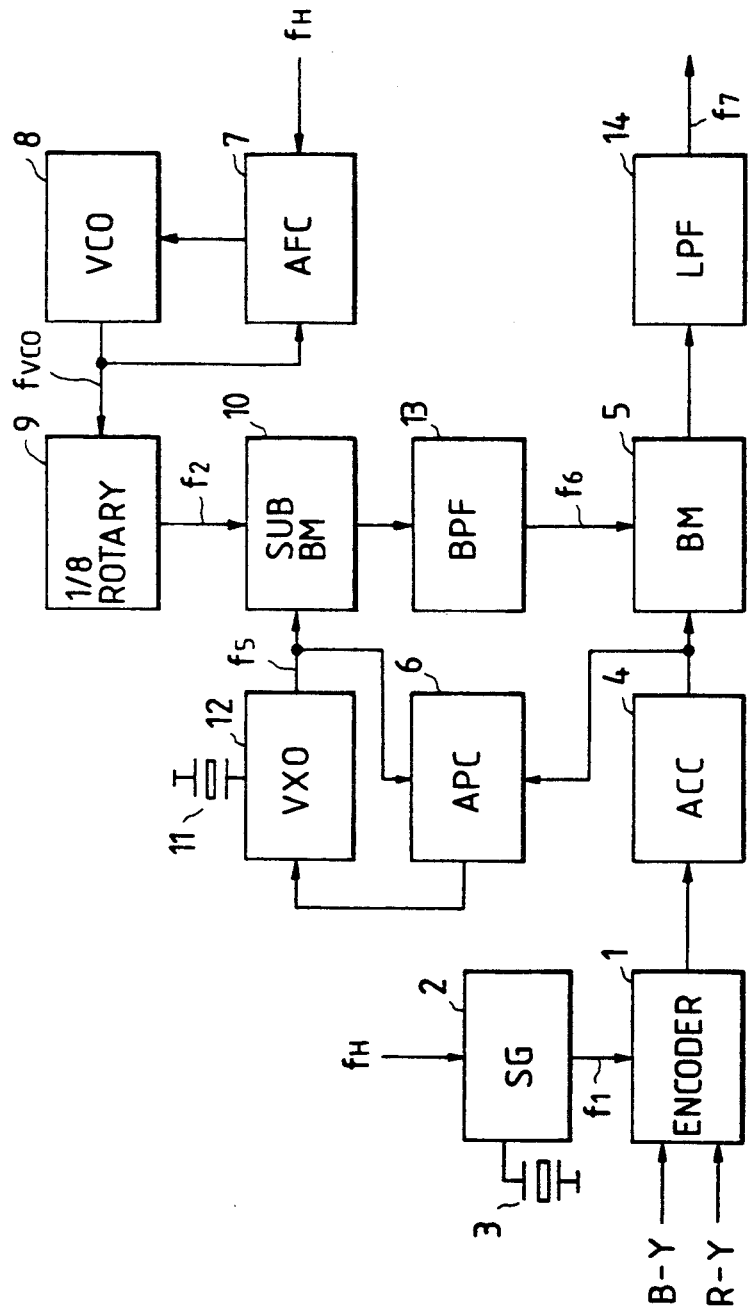
FIG. 9 is a block diagram of a prior art video signal processing apparatus.

FIG. 9 shows a prior art video signal processing apparatus used in a movie. In FIG. 9, color difference signals "B-Y" and "R-Y" are fed to an encoder 1. The color difference signal "B-Y" agrees with a difference between a blue signal "B" and a luminance signal "Y". The color difference signal "R-Y" agrees with a difference between a red signal "R" and the luminance signal "Y". A signal generator (SG) 2 generates a subcarrier f1 on the basis of a horizontal sync signal fH and the output signal from a first quartz resonator 3. The encoder 1 modulates the subcarrier f1 with the color difference signals "B-Y" and "R-Y" in quadrature modulation, and generates a modulation output signa. The modulation output signal from the encoder 1 is subjected to gain control by an automatic color controller (ACC) 4. The output signal from the automatic color controller 4 is fed to a balanced modulator (BM) 5. In addition, the output signal from the automatic color controller 4 is fed to an automatic phase controller (APC) 6 which will be explained later.

The horizontal sync signal fH is fed to an automatic frequency controller (AFC) 7. The automatic frequency controller 7 and a voltage-controlled oscillator (VCO) 8 are connected to compose a phase locked loop (PLL). The automatic frequency controller 7 has a part which compares the phases of the horizontal sync signal fH and the output signal fVCO from the voltage-controlled oscillator 8. The voltage-controlled oscillator 8 is controlled in response to the result of the phase comparison executed by the automatic frequency controller 7 so that the frequency of the output signal fVCO from the voltage-controlled oscillator 8 will be locked to a specified frequency which has a fixed relation with the frequency of the horizontal sync signal fH. The specified frequency equals 320 fH in the case of an NTSC system, and equals 321 fH in the case of a PAL system. The output signal fVCO from the voltage-controlled oscillator 8 is fed to a $\frac{1}{8}$ rotary (a $\frac{1}{8}$ frequency divider) 9. The $\frac{1}{8}$ rotary 9 divides the frequency of the signal fVCO by 8 and outputs a frequency-division signal f2. The frequency of the output signal f2 from the $\frac{1}{8}$ rotary 9 equals 40 fH in the case of an NTSC system, and equals $\{40 - (\frac{1}{8})\}$ fH in the case of a PAL system. The output signal f2 from the $\frac{1}{8}$ rotary 9 is fed to a sub balanced modulator (SUB BM) 10.

A second quartz resonator 11 connected to a voltage-controlled variable-frequency crystal oscillator (VXO) 12 determines the fundamental frequency of the oscillation of the voltage-controlled oscillator 12. The voltage-controlled oscillator 12 and the automatic phase controller 6 are connected to compose a phase locked loop (PLL). The automatic phase controller 6 has a part which compares the phases of the output signal from the automatic color controller and the output signal f5 from the voltage-controlled oscillator 12. The voltage-controlled oscillator 12 is controlled in response to the result of the phase comparison executed by the automatic phase controller 6 so that the output signal f5 from the voltage-controlled oscillator 12 will be locked in phase to the output signal from the automatic color controller 4. The output signal f5 from the voltage-controlled oscillator 12 is fed to the sub balanced modulator 10.

The sub balanced modulator 10 modulates the output signal f2 from the $\frac{1}{8}$ rotary 9 with the output signal f5 from the voltage-controlled oscillator 12, and generates modulation output signals "f2+f5" and "f2−f5". A band pass filter (BPF) 13 following the sub balanced modulator 10 removes the modulation output signal "f2−f5" and passes only the modulation output signal "f2+f5". The output signal f6 from the band pass filter 13 which agrees with the modulation output signal "f2+f5" is fed to the balanced modulator 5.

The balanced modulator 5 modulates the output signal from the automatic color controller 4 with the output signal f6 from the band pass filter 13, and generates modulation output signals "f6+f1" and "f6−f1". A low pass filter (LPF) 14 following the balanced modulator 5 removes the modulation output signal "f6+f1" and passes only the modulation output signal "f6−f1". The output signal f7 from the low pass filter 14 which agrees with the modulation output signal "f6−f1" is recorded into a magnetic tape (not shown) via a recording amplifier and a recording head (both not shown).

The prior art video signal processing apparatus of FIG. 9 is used in the movie which includes a combination of a video camera and a video cassette tape recorder (VCR). In the prior art video signal processing apparatus of FIG. 9, the encoder 1 and the signal generator 2 are inherent in the video camera, while the automatic color controller 4 and the later devices are inherent in the VCR. The prior art video signal processing apparatus of FIG. 9 is formed by merely combining the electrical circuits of the video camera and the VCR. Thus, the prior art video signal processing apparatus of FIG. 9 has the two quartz resonators 3 and 11 and has a redundant part. The fabrication of the prior art video signal processing apparatus of FIG. 9 by an integrated circuit tends to be troublesome.

In the prior art video signal processing apparatus of FIG. 9, since the modulating signal f5 fed to the sub balanced modulator 10 is generated by use of the automatic phase controller 6, jitter components caused in the automatic phase controller 6 are down-converted by the balanced modulator 5 and the down-converted jitter components tends to be recorded into the tape. An image reproduced on the basis of the recorded signal tends to be contaminated by these jitter components.

A further description will be given of the jitter components. The jitter components caused in the automatic phase controller 6 are now represented by the character ΔfAPC. The relation among the jitter components ΔfAPC and the signals f1, f2, f5, f6, and f7 are expressed as follows.

$$f5 = f1 + \Delta fAPC \quad (1)$$

$$\begin{aligned} f6 &= f2 + f5 \\ &= f2 + f1 + \Delta fAPC \end{aligned} \quad (2)$$

$$\begin{aligned} f7 &= f6 - f1 \\ &= f2 + f1 + \Delta fAPC - f1 \\ &= f2 + \Delta fAPC \end{aligned} \quad (3)$$

As understood from the equation (3), the record signal f7 contains the jitter components ΔfAPC caused by the automatic phase controller 6. The signal f7 with the jitter components ΔfAPC is recorded into the tape.

DESCRIPTION OF THE FIRST PREFERRED EMBODIMENT

Figure 1:
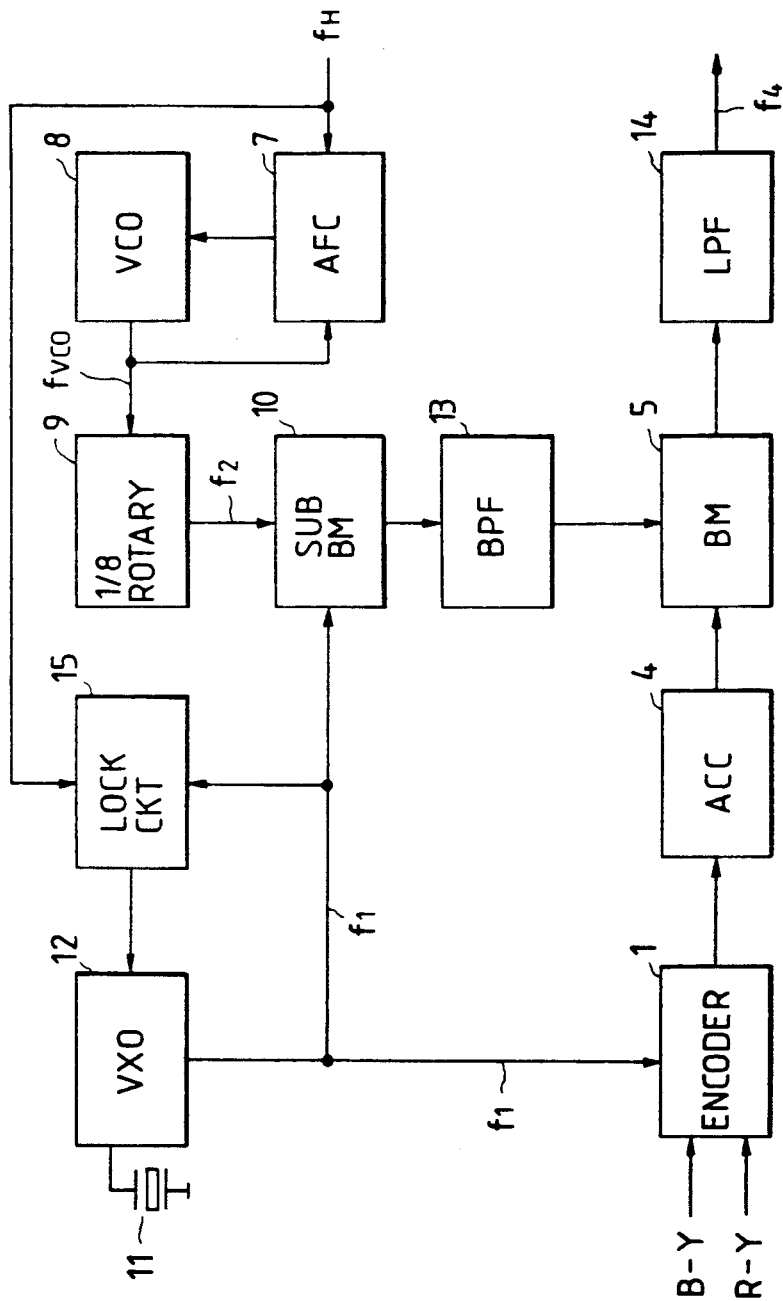
FIG. 1 is a block diagram of a video signal processing apparatus according to a first embodiment of this invention.

FIG. 1 shows a video signal processing apparatus according to a first embodiment of this invention. In FIG. 1, color difference signals "B-Y" and "R-Y" are fed to an encoder 1. The color difference signal "B-Y" agrees with a difference between a blue signal "B" and a luminance signal "Y". The color difference signal "R-Y" agrees with a difference between a red signal "R" and the luminance signal "Y". A voltage-controlled frequency-variable crystal oscillator (VXO) 12 outputs a subcarrier f1 to the encoder 1. A quartz resonator 11 connected to the voltage-controlled oscillator 12 determines the fundamental frequency of the oscillation of the voltage-controlled oscillator 12. As will be explained later, the subcarrier f1 has a fixed frequency relation with a horizontal sync signal fH, and specifically the frequency of the subcarrier f1 essentially equals a predetermined number times a quarter of the frequency of the horizontal sync signal. The encoder 1 modulates the subcarrier f1 with the color difference signals "B-Y" and "R-Y" in quadrature modulation, and generates a modulation output signal. The modulation output signal from the encoder 1 is subjected to gain control by an automatic color controller (ACC) 4. The output signal from the automatic color controller 4 is fed to a balanced modulator (BM) 5. In addition, the subcarrier f1 is fed from the voltage-controlled oscillator 12 to a sub balanced modulator (SUB BM) 10 and an fH lock circuit 15 which will be explained later.

The horizontal sync signal fH is fed to an automatic frequency controller (AFC) 7. The automatic frequency controller 7 and a voltage-controlled oscillator (VCO) 8 are connected to compose a phase locked loop (PLL). The automatic frequency controller 7 has a part which compares the phases of the horizontal sync signal fH and the output signal fVCO from the voltage-controlled oscillator 8. The voltage-controlled oscillator 8 is controlled in response to the result of the phase comparison executed by the automatic frequency controller 7 so that the frequency of the output signal fVCO from the voltage-controlled oscillator 8 will be locked to a specified frequency which has a fixed relation with the frequency of the horizontal sync signal fH. The specified frequency equals 320 fH in the case of an NTSC system, and equals 321fH in the case of a PAL system. The output signal fVCO from the voltage-controlled oscillator 8 is fed to a ⅛ rotary (a ⅛ frequency divider) 9. The ⅛ rotary 9 divides the frequency of the signal fVCO by 8 and outputs a frequency-division signal f2. The frequency of the output signal f2 from the ⅛ rotary 9 equals 40fH in the case of an NTSC system, and equals $\{40+(\frac{1}{8})\}$ fH in the case of a PAL system. The output signal f2 from the ⅛ rotary 9 is fed to the sub balanced modulator 10.

The horizontal sync signal fH is also fed to the fH lock circuit 15. The fH lock circuit 15 and the voltage-controlled oscillator 12 are connected to compose a phase locked loop (PLL). The fH lock circuit 15 has a part which compares the phases of the subcarrier f1 and the horizontal sync signal fH. The voltage-controlled oscillator 12 is controlled in response to the result of the phase comparison executed by the fH lock circuit 15 so that the subcarrier f1 will be locked in phase to the horizontal sync signal fH and that the subcarrier f1 will have a fixed frequency relation with the horizontal sync signal fH.

The sub balanced modulator 10 mixes the subcarrier f1 and the output signal f2 from the ⅛ rotary 9, and generates mixed output signals "f1+f2" and "f1−f2". A band pass filter (BPF) 13 following the sub balanced modulator 10 removes the mixed output signal "f1−f2" and passes only the modulation output signal "f1+f2". The output signal f3 from the band pass filter 13 which agrees with the mixed output signal "f1+f2" is fed to the balanced modulator 5.

The balanced modulator 5 modulates the output signal f3 from the band pass filter 13 with the output signal from the automatic color controller 4, and generates modulation output signals "f3+f1" and "f3−f1". A low pass filter (LPF) 14 following the balanced modulator 5 removes the modulation output signal "f3+f1" and passes only the modulation output signal "f3−f1". The output signal f4 from the low pass filter 14 which agrees with the modulation output signal "f3−f1" is recorded into a magnetic tape (not shown) via a recording amplifier and a recording head (both not shown).

The video signal processing apparatus of FIG. 1 dispenses with an automatic phase controller and thus prevents an adverse effect caused by the automatic phase controller. Specifically, the signals f1, f2, f3, and f4 have the following relations.

$$f3 = f1 - f2 \quad (4)$$

$$f4 = f3 - f1 \quad (5)$$

The equations (4) and (5) are combined into the following equation.

$$\begin{aligned} f4 &= f1 - f2 - f1 \\ &= f2 \end{aligned} \quad (6)$$

As understood from the equation (6), the record signal f4 is substantially free from any effective jitter components. Thus, the quality of the signal recorded into the tape can be high.

According to a more strict analysis, the two phase-locked loops in the video signal processing apparatus of FIG. 1 cause jitter components. Such jitter components are negligible for the reasons as follows. In the phase-locked loop including the automatic frequency controller 7 and the voltage-controlled oscillator 8, a frequency divider divides the frequency of the signal fVCO by a large number, and the output signal from the frequency divider and the horizontal sync signal fH are compared in phase to generate the control signal fed to the voltage-controlled oscillator 8. Dividing the frequency of the signal fVCO by the large number enables the related phase-locked loop to cause only negligible jitter components. In the phase-locked loop including the voltage-controlled oscillator 12 and the fH lock circuit 15, a frequency divider divides the frequency of the signal f1 by a large number and another frequency divider divides the frequency of the signal fH by a given number, and the output signals from these frequency dividers are compared in phase to generate the control signal fed to the voltage-controlled oscillator 12. Dividing the frequency of the signal f1 by the large number enables the related phase-locked loop to cause only negligible jitter components.

Figure 2:
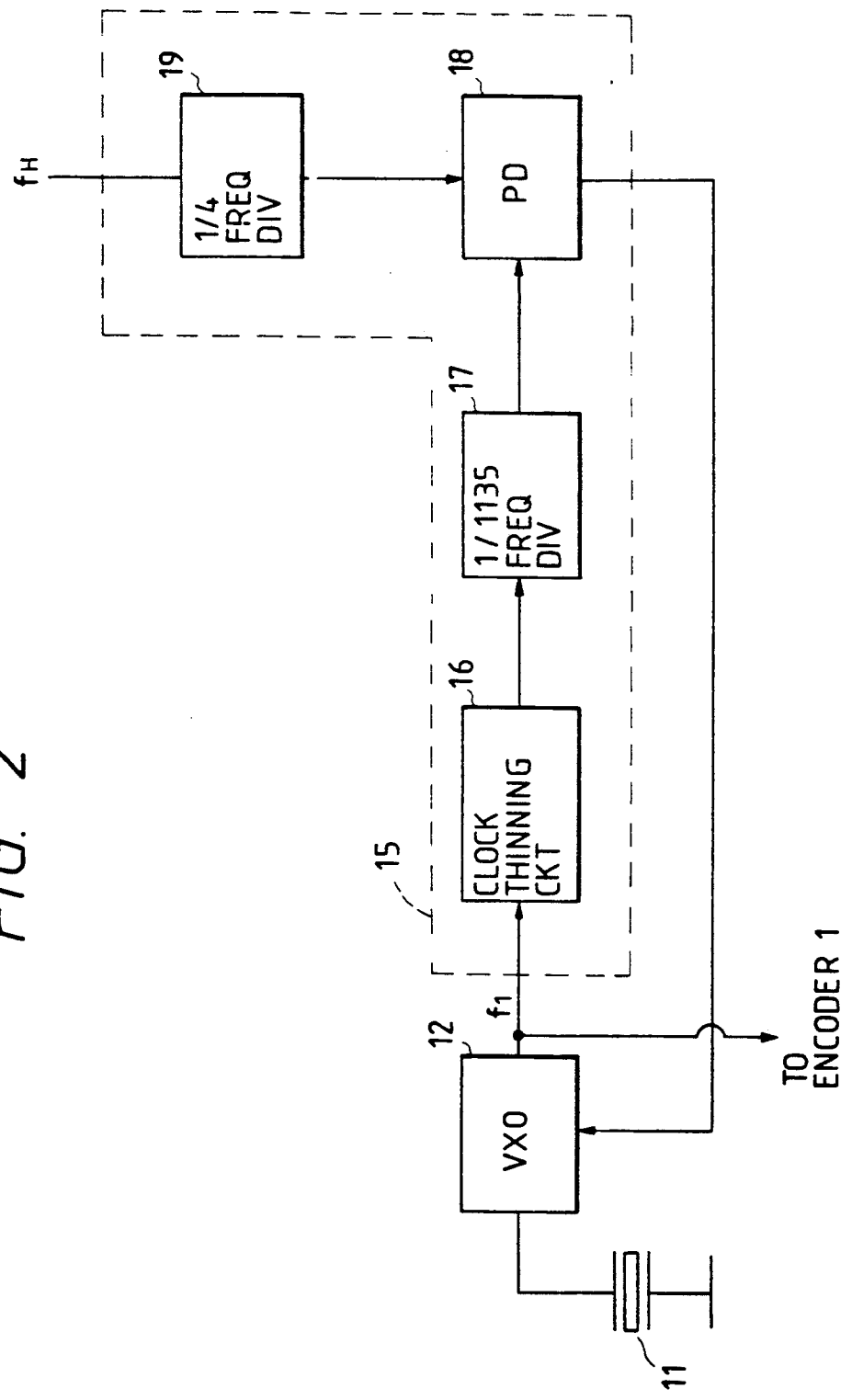
FIGS. 2 and 3 are block diagrams of the fH lock circuit of FIG. 1.

As shown in FIG. 2, the fH lock circuit 15 includes a clock thinning circuit 16, a 1/1135 frequency divider 17, a phase comparator (a phase detector:PD) 18, and a ¼ frequency divider 19.

The fundamental oscillation frequency of the voltage-controlled circuit 12 is determined by the quartz resonator 11. In the case of a PAL system, the frequency of the output signal f1 from the voltage-controlled oscillator 12 is chosen as indicated by the following equation.

$$f1 = \{(1135fH/4) + (fV/2)\} \quad (7)$$

where fV denotes the frequency of a vertical sync signal. The clock thinning circuit 16 thins out pulses of the output signal f1 from the voltage-controlled oscillator 12 which correspond to the term "fV/2" of the equation (7). Thus, the clock thinning circuit 16 outputs a signal which agrees with the term "1135fH/4" of the equation (7).

It should be noted that the value of the term "fV/2" is negligibly small relative to the value of the term "1135fH/4" and therefore the frequency of the output signal from the clock thinning circuit 16 will be regarded as being equal to the frequency of the signal f1 in the following description.

The output signal from the clock thinning circuit 16 is exposed to 1/1135 frequency division by the 1/1135 frequency divider 17. The 1/1135 frequency divider 17 outputs a signal having a frequency equal to the frequency "f1/1135". The output signal from the 1/1135 frequency divider 17 is fed to a first input terminal of the phase comparator 18.

The horizontal sync signal fH is exposed to ¼ frequency division by the ¼ frequency divider 19. The ¼ frequency divider outputs a signal having a frequency equal to the frequency "fH/4". The output signal from the ¼ frequency divider 19 is fed to a second input terminal of the phase comparator 18. The phase comparator 18 compares the phases of the output signals from the devices 17 and 19, and outputs a signal representing a result of the phase comparison. The voltage-controlled oscillator 12 is controlled by the output signal from the phase comparator 18 so that the phase of the output signal from the device 17 will be locked to the phase of the output signal from the device 19. Under these locked conditions, the frequencies of the signals f1 and fH have the following relation.

$$f1/1135 = fH/4 \tag{8}$$

The equation (8) is transformed into the following equation.

$$f1 = 1135fH/4 \tag{9}$$

As understood from the equations (8) and (9), it is possible to obtain the oscillation output signal f1 which satisfies the PAL standards.

Figure 3:
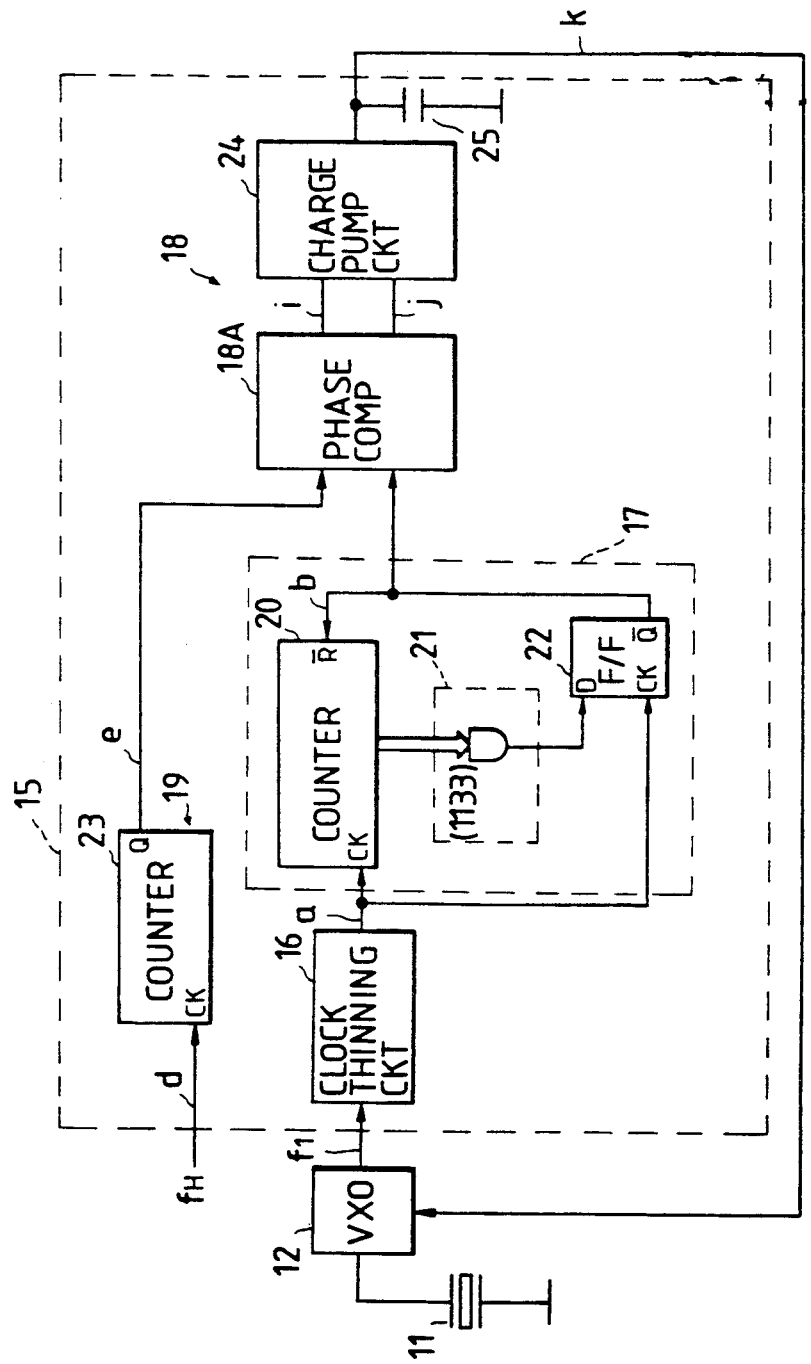
Figure 4:
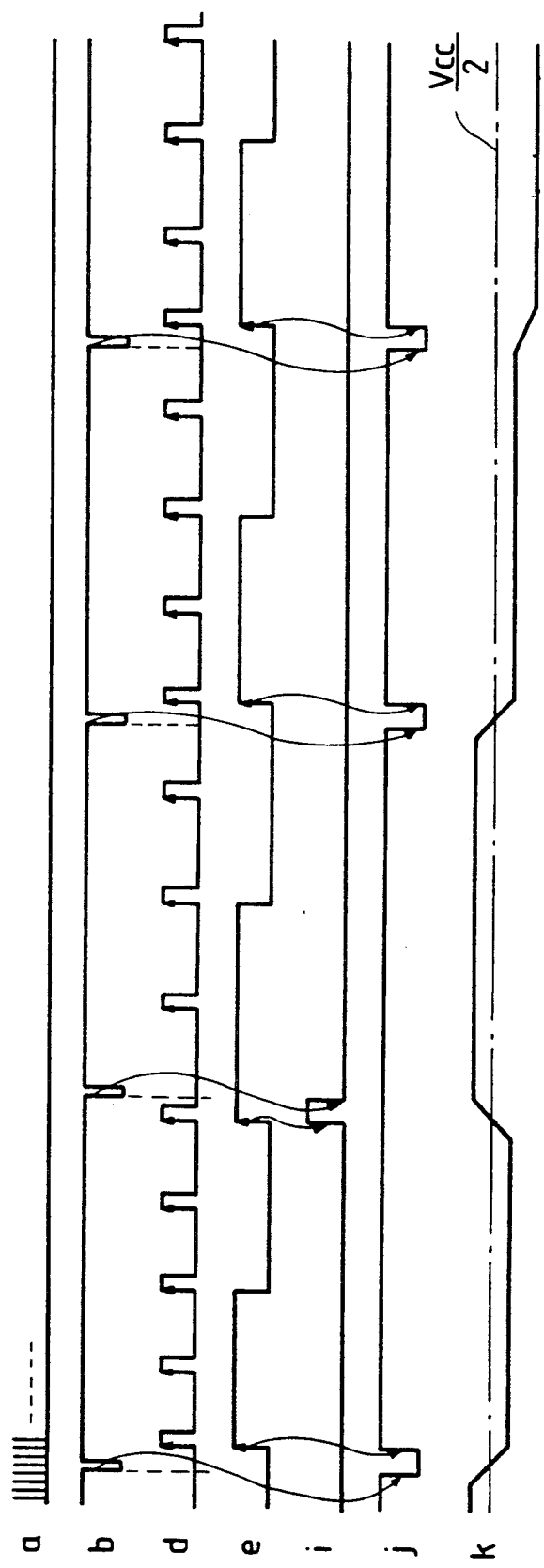
FIG. 4 is a timing diagram showing the waveforms of various signals in the fH lock circuit of FIG. 3.

The fH lock circuit 15 will be further described with reference to FIGS. 3 and 4. The clock thinning circuit 16 thins out pulses of the output signal f1 from the voltage-controlled oscillator 12 which correspond to the term "fV/2" of the equation (7). Thus, the clock thinning circuit 16 outputs a signal "a" which agrees with the term "1135fH/4" of the equation (7). The 1/1135 frequency divider 17 includes an 11-bit binary counter 20, a decoder 21, and a D flip-flop (shortened to "D-FF" hereinafter) 22. The output signal "a" from the clock thinning circuit 16 is fed to clock terminals CK of the 11-bit binary counter 20 and the D-FF 22. When the number of the clock pulses counted by the 11-bit binary counter 20 reaches 1133, the output signal from the counter 20 is decoded by the decoder 21 and the output signal from the decoder 21 is fed to a D input terminal of the D-FF 22. As a result, a clock signal "b" which corresponds to two clocks in the output signal "a" of the clock thinning circuit 16 appears at an output terminal Q̄ of the D-FF 22. The clock signal "b" is fed to a reset terminal R̄ of the 11-bit binary counter 20 as a reset signal resetting the counter 20. As a result of the cooperation of the devices 20-22, the frequency of the signal "a" is divided by 1135. The resultant frequency-division signal is the reset signal "b" which is fed to one input terminal of a phase comparing section 18A of the phase comparator 18.

The ¼ frequency divider 19 includes a 2-bit binary counter 23 having a clock terminal CK subjected to the horizontal sync signal fH which is represented as a signal "d". A signal "e" which agrees with ¼ frequency division of the horizontal sync signal fH appears at an output terminal Q of the 2-bit binary counter 23. This signal "e" is fed to the other input terminal of the phase comparing section 18A of the phase comparator 18. The phase comparing section 18A compares the phases of the signals "b" and "e" at their active edges, generating signals "i" and "j" having polarities and pulse widths dependent on the difference between the phases of the two signals. The signals "i" and "j" are fed to a charge pump circuit 24 within the phase comparator 18. The charge pump circuit 24 controls charging and discharging of a capacitor 25 in response to the polarities and the pulse widths of the signals "i" and "j". The voltage "k" across the capacitor 25 is used as a control signal fed to the voltage-controlled oscillator 12. The level of the control signal "k" varies around a reference level Vcc/2 in dependence upon the conditions of the signals "i" and "j". The frequency of the oscillation of the voltage-controlled oscillator 12 is controlled in response to the control signal "k". As a result, the phase-locked loop of FIG. 3 operates to lock the phase of the signal "b" to the phase of the signal "e" and to enable the previously-mentioned frequency relation (7) between the signals f1 and fH to be satisfied.

DESCRIPTION OF THE SECOND PREFERRED EMBODIMENT

Figure 5:
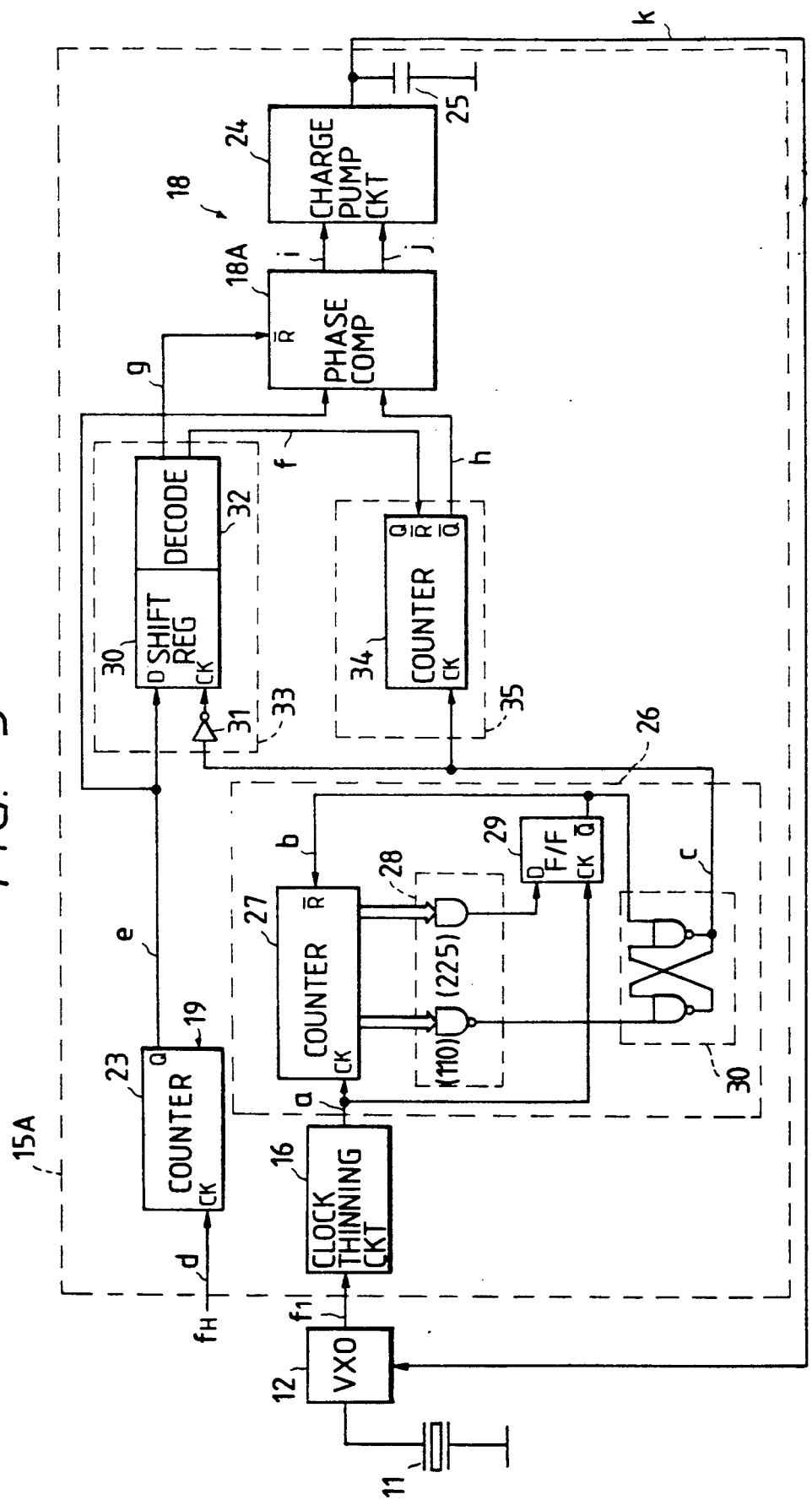
FIG. 5 is a block diagram of an fH lock circuit in a video signal processing apparatus according to a second embodiment of this invention.
Figure 6:
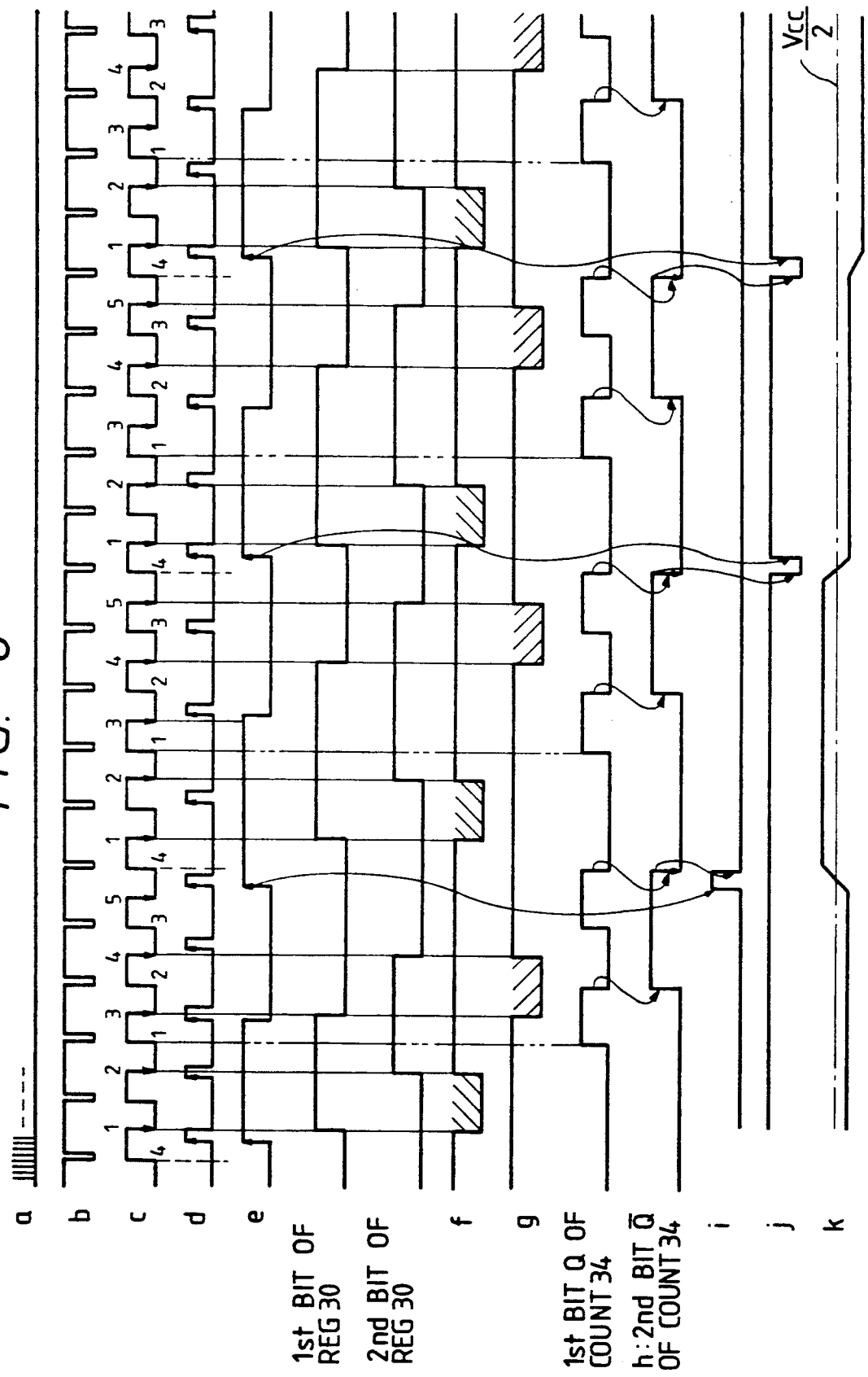
FIG. 6 is a timing diagram showing the waveforms of various signals in the fH lock circuit of FIG. 5.

FIGS. 5 and 6 relate to a second embodiment of this invention which is similar to the embodiment of FIGS. 1-4 except for an fH lock circuit 15A.

As shown in FIG. 5, the fH lock circuit 15A includes a clock thinning circuit 16, a phase comparator 18, a ¼ frequency divider 19, a 1/227 frequency divider 26, a 1/5 frequency divider 35, and a delay circuit 33. The clock thinning circuit 16 thins out pulses of an output signal f1 from a voltage-controlled oscillator 12 which correspond to the term "fV/2" of the equation (7). Thus, the clock thinning circuit 16 outputs a signal "a" which agrees with the term "1135fH/4" of the equation (7). The output signal "a" from the clock thinning circuit 16 is fed to the 1/227 frequency divider 26.

The 1/227 frequency divider 26 includes an 8-bit binary counter 27, a decoder 28, a D-FF 29, and an RS latch circuit 30. The signal "a" is fed to clock terminals CK of the 8-bit binary counter 27 and the D-FF 29. When the number of the clock pulses counted by the 8-bit binary counter 27 reaches 110, a NAND gate within the decoder 28 outputs a pulse to the RS latch circuit 30. When the number of the clock pulses counted by the 8-bit binary counter 27 reaches 225, an AND gate within the decoder 28 outputs a pulse to a D input terminal of the D-FF 29 so that a reset pulse "b" having a pulse width corresponding to two clocks appears at an output terminal Q̄ of the D-FF 29. The reset pulse "b" is fed to a reset terminal R̄ of the 8-bit binary counter 27, resetting the counter 27. In addition, the reset pulse "b" is fed to the RS latch circuit 30. The RS latch circuit 30 is set and reset by the pulse from the NAND gate within the decoder 28 and the reset pulse "b" from the D-FF 29, so that the RS latch circuit 30 outputs a frequency-division signal "c" having a frequency which equals 1/227 times the frequency of the signal "a". Since the NAND gate within the decoder 28 outputs a pulse at a count number of 110 which is approximately equal to a half of 225, the duty cycle of the 1/227 frequency-division signal "c" is equal to about 50%.

The horizontal sync signal fH which equals a signal "d" is fed to a clock terminal CK of a 2-bit binary counter 23 within the ¼ frequency divider 19. A signal "e" having a frequency equal to a quarter of the frequency of the horizontal sync signal fH appears at an output terminal Q of the 2-bit binary counter 23. The frequency-division signal "e" is fed to a D input terminal of a 2-bit shift register 30 within the delay circuit 33. A clock terminal CK of the 2-bit shift register 30 receives the 1/227 frequency-division signal "c" from the 1/227 frequency divider 26 via an inverter 31 within the delay circuit 33. As shown in FIG. 6, the frequency-division signal "e" is periodically sampled and held in the first bit of the 2-bit shift register 30 in response to the 1/227 frequency-division signal "c", and the sampled and held signal is periodically shifted from the first bit to the second bit of the 2-bit shift register 30 in response to the 1/227 frequency-division signal "c". A decoder 32 within the delay circuit 33 decodes the signals in the first and second bits of the 2-bit shift register 30 into signals "f" and "g" respectively. The signal "g" is delayed from the signal "f" by a time corresponding to two periods of the 1/227 frequency-division signal "c".

The signal "f" is fed from the delay circuit 33 to a reset terminal $\overline{R}$ of a 2-bit binary counter 34 within the 1/5 frequency divider 35. A clock terminal CK of the 2-bit binary counter 34 receives the 1/227 frequency-division signal "c" from the 1/227 frequency divider 26. As shown in FIG. 6, during each interval after the 2-bit binary counter 34 is reset by the signal "f", the first bit of the 2-bit binary counter 34 periodically changes between a high level and a low level in synchronism with rising edges "1"-"4" of the 1/227 frequency-division signal "c". The first bit of the 2-bit binary counter 34 is reset by the signal "f" immediately after each rising edge "4" of the 1/227 frequency-division signal "c". The second bit of the 2-bit binary counter 34 periodically changes between a high level and a low level in synchronism with falling variations in the first bit thereof. Although the counter 34 is of the 2-bit type, resetting the counter 34 by the signal "f" enables the counter 34 to perform an operation of 1/5 frequency division. Thus, a signal "h" having a frequency equal to 1/5 times the frequency of the signal "c" appears at an output terminal Q of the 2-bit binary counter 34. The frequencies of the signals "h" and f1 have the following relation.

$$h = (f1/227) \cdot (1/5) = f1/1135 \quad (10)$$

The output signal "h" from the 1/5 frequency divider 35 is fed to one input terminal of a phase comparing section 18A of the phase comparator 18. The output signal "e" from the ¼ frequency divider 19 is fed to the other input terminal of the phase comparing section 18A. The frequencies of the signals "e" and fH have the following relation.

$$e = fH/4 \quad (11)$$

The output signal "g" from the delay circuit 33 is fed to a reset terminal $\overline{R}$ of the phase comparing section 18A. The phase comparing section 18A compares the phase of the signal "e" at its rising edge and the phase of the signal "h" at its falling edge, generating signals "i" and "j" having polarities and pulse widths dependent on the difference between the phases of the two signals. The signals "i" and "j" are fed to a charge pump circuit 24 within the phase comparator 18. The charge pump circuit 24 controls charging and discharging of a capacitor 25 in response to the polarities and the pulse widths of the signals "i" and "j". The voltage "k" across the capacitor 25 is used as a control signal fed to the voltage-controlled oscillator 12. The level of the control signal "k" varies around a reference level Vcc/2 in dependence upon the conditions of the signals "i" and "j". The frequency of the oscillation of the voltage-controlled oscillator 12 is controlled in response to the control signal "k". As a result, the phase-locked loop of FIG. 5 operates to lock the phase of the signal "h" to the phase of the signal "e" and to enable the previously-mentioned frequency relation (7) between the signals f1 and fH to be satisfied.

The fH lock circuit 15A will be further described. A falling edge of the signal "h" is synchronous with a rising edge "4" of the signal "c". Accordingly, the phase comparing section 18A compares the phase of the ¼ frequency-division signal "e" at its rising edge and the phase of the 1/227 frequency-division signal at its rising edge, and controls the loop to synchronize the phases of the two signals "e" and "c". It is preferable that the variable frequency range Δf1 of the voltage-controlled oscillator 12 is chosen as "Δf1 = 4.43 MHz ± 1 kHz". Therefore, as shown in FIG. 6, a rising edge of the signal "e" always resides in a period determined by adjacent falling edges "5" and "1" of the signal "c". After the 2-bit binary counter 34 completes ¼ frequency division, it is reset by the signal "f" to perform 1/5 frequency division. Thus, a rising edge of the output signal "e" from the 1/4 frequency divider 19 approximately concurs with the rising edge "4" of a fifth pulse of the 1/227 frequency-division signal "c". A similar description will be given in the following. Five pulses of the 1/227 frequency-division signal "c" reside in one period of the signal "e". Therefore, at around a next rising edge of the signal "e", a falling edge of the signal "h" is always present. Thus, a rising edge of the signal "e" approximately concurs with a falling edge of the signal "h". In cases where the phase-locked loop moves out of the locked conditions by some cause, immediately after the phases of a next pulse of the signal "e" and a fifth pulse of the signal "c" are approximately accorded with each other, a first phase comparison enables the loop to move into steady conditions. Accordingly, the phase-locked loop can quickly return to the locked conditions. In other words, a lock-up time can be short. Specifically, under the steady conditions, the phase of a rising edge of the signal "e" and the phase of a falling edge of the signal "h" are compared, and the voltage-controlled oscillator 12 is controlled in response to the result of the phase comparison. As a result of the control of the voltage-controlled oscillator 12, the phase-locked loop returns to the locked conditions.

The output signal "g" from the decoder 32 is fed to the reset terminal $\overline{R}$ of the phase comparing section 18A so that the signal "g" resets the phase comparing section 18A. As shown in FIG. 6, the signal "g" has low-level pulses which are approximately synchronous with falling edges of the signal "e" and which have a duration equal to one period of the signal "c". The phase comparing section 18A are periodically reset by the pulses in the signal "g". Resetting the phase comparing section 18A forces the phase comparison section 18A to move into a state which equals a state occurring upon the completion of one phase comparing operation. Therefore, immediately after resetting the phase comparing section 18A by the signal "g" is completed, the loop can move into steady conditions in response to the result of the phase comparison between the edges of the signals "e" and "h". In this regard, it is also possible to greatly short the lock-up time between the moment of the movement out of the locked conditions and the movement of the return to the locked conditions.

DESCRIPTION OF THE THIRD PREFERRED EMBODIMENT

Figure 7:
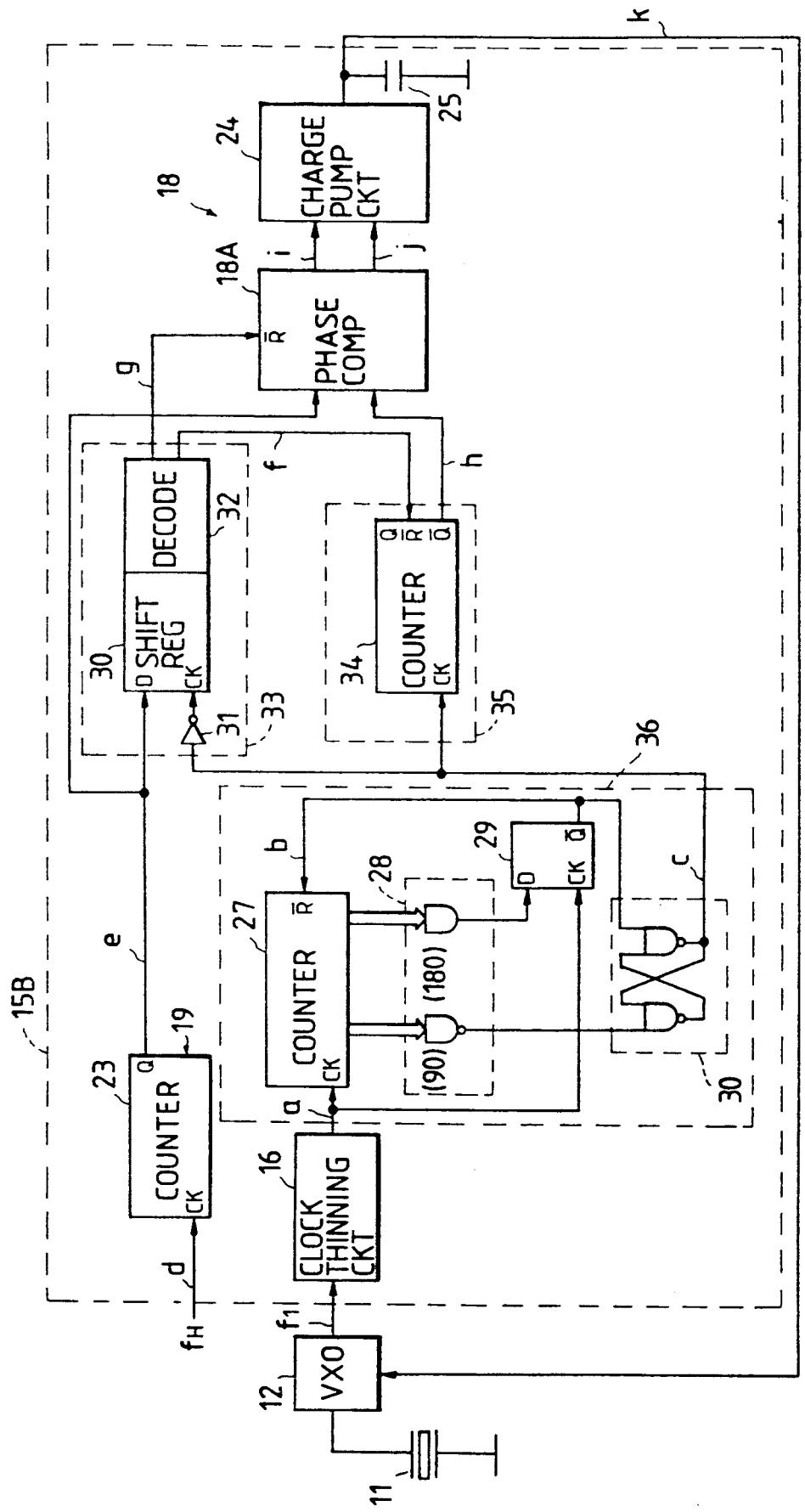
FIG. 7 is a block diagram of an fH lock circuit in a video signal processing apparatus according to a third embodiment of this invention.

FIG. 7 shows a part of a third embodiment of this invention which is similar to the embodiment of FIGS. 1-4 except for an fH lock circuit 15B and design changes indicated hereinafter. The third embodiment is designed for an NTSC system. According to the NTSC system standards, the frequency of an output signal (a subcarrier) f1 from a voltage-controlled oscillator 12 is chosen so as to have the following relation with the frequency of a horizontal sync signal fH.

$$f1/910 = fH/4 \qquad (12)$$

As shown in FIG. 7, the fH lock circuit 15B includes a phase comparator 18, a ¼ frequency divider 19, a delay circuit 33, a 1/5 frequency divider 35, and a 1/182 frequency divider 36. The output signal f1 from the voltage-controlled oscillator 12 is fed to the 1/182 frequency divider 36.

The 1/182 frequency divider 36 includes an 8-bit binary counter 27, a decoder 28, a D-FF 29, and an RS latch circuit 30. The signal f1 is fed to clock terminals CK of the bit 8-bit binary counter 27 and the D-FF 29. When the number of the clock pulses counted by the 8-bit binary counter 27 reaches 90, and NAND gate within the decoder 28 outputs a pulse to the RS latch circuit 30. When the number of the clock pulses counted by the 8-bit binary counter 27 reaches 180, an AND gate within the decoder 28 outputs a pulse to a D input terminal of the D-FF 29 so that a reset pulse "b" having a pulse width corresponding to two clocks appears at an output terminal $\overline{Q}$ of the D-FF 29. The reset pulse "b" is fed to a reset terminal $\overline{R}$ of the 8-bit binary counter 27, resetting the counter 27. In addition, the reset pulse "b" is fed to the RS latch circuit 30. The RS latch circuit 30 is set and reset by the pulse from the NAND gate within the decoder 28 and the reset pulse "b" from the D-FF 29, so that the RS latch circuit 30 outputs a frequency-division signal "c" having a frequency which equals 1/182 times the frequency of the signal f1. Since the NAND gate within the decoder 28 outputs a pulse at a counter number of 90 which is equal to a half of 180, the duty cycle of the 1/182 frequency-division signal "c" is essentially equal to 50%.

The horizontal sync signal fH which equals a signal "d" is fed to a clock terminal CK of a 2-bit binary counter 23 within the ¼ frequency divider 19. A signal "e" having a frequency equal to a quarter of the frequency of the horizontal sync signal fH appears at an output terminal Q of the 2-bit binary counter 23. The frequency-division signal "e" is fed to a D input terminal of a 2-bit shift register 30 within the delay circuit 33. A clock terminal CK of the 2-bit shift register 30 receives the 1/182 frequency-division signal "c" from the 1/182 frequency divider 36 via an inverter 31 within the delay circuit 33. The frequency-division signal "e" is periodically sampled and held in the first bit of the 2-bit shift register 30 in response to the 1/182 frequency-division signal "c", and the sampled and held signal is periodically shifted from the first bit to the second bit of the 2-bit shift register 30 in response to the 1/182 frequency-division signal "c". A decoder 32 within the delay circuit 33 decodes the signals in the first and second bits of the 2-bit shift register 30 into signals "f" and "g" respectively. The signal "g" is delayed from the signal "f" by a time corresponding to two periods of the 1/182 frequency-division signal "c".

The signal "f" is fed from the delay circuit 33 to a reset terminal $\overline{R}$ of a 2-bit binary counter 34 within the 1/5 frequency divider 35. A clock terminal CK of the 2-bit binary counter 34 receives the 1/182 frequency-division signal "c" from the 1/182 frequency divider 26. As in the embodiment of FIG. 5, the counter 34 performs an operation of 1/5 frequency division. Thus, a signal "h" having a frequency equal to 1/5 times the frequency of the signal "c" appear at an output terminal $\overline{Q}$ of the 2-bit binary counter 34. The frequencies of the signals "h" and f1 have the following relation.

$$h = (f1/182) \cdot (1/5) = f1/910 \qquad (13)$$

The output signal "h" from the 1/5 frequency divider 35 is fed to one input terminal of a phase comparing section 18A of the phase comparator 18. The output signal "e" form the ¼ frequency divider 19 is fed to the other input terminal of the phase comparing section 18A. The frequencies of the signals "e" and fH have the following relation.

$$e = fH/4 \qquad (14)$$

The output signal "g" from the delay circuit 33 is fed to a reset terminal $\overline{R}$ of the phase comparing section 18A. The phase comparing section 18A compares the phase of the signal "e" at its rising edge and the phase of the signal "h" its falling edge, generating signals "i" and "j" having polarities and pulse widths dependent on the difference between the phases of the two signals. The signals "i" and "j" are fed to a charge pump circuit 24 within the phase comparator 18. The charge pump circuit 24 controls charging and discharging of a capacitor 25 in response to the polarities and the pulse widths of the signals "i" and "j". The voltage "k" across the capacitor 25 is used as a control signal fed to the voltage-controlled oscillator 12. The level of the control signal "k" varies around a reference level Vcc/2 in dependence upon the conditions of the signals "i" and "j". The frequency of the oscillation of the voltage-controlled oscillator 12 is controlled in response to the control signal "k". As a result, the phase-locked loop of FIG. 7 operates to lock the phase of the signal "h" to the phase of the signal "e" and to enable the previously-mentioned frequency relation (12) between the signals f1 and fH to be satisfied.

The fH lock circuit 15B of FIG. 7 produces advantages similar to the advantages of the fH lock circuit 15A of FIG. 5.

DESCRIPTION OF THE FOURTH PREFERRED EMBODIMENT

Figure 8:
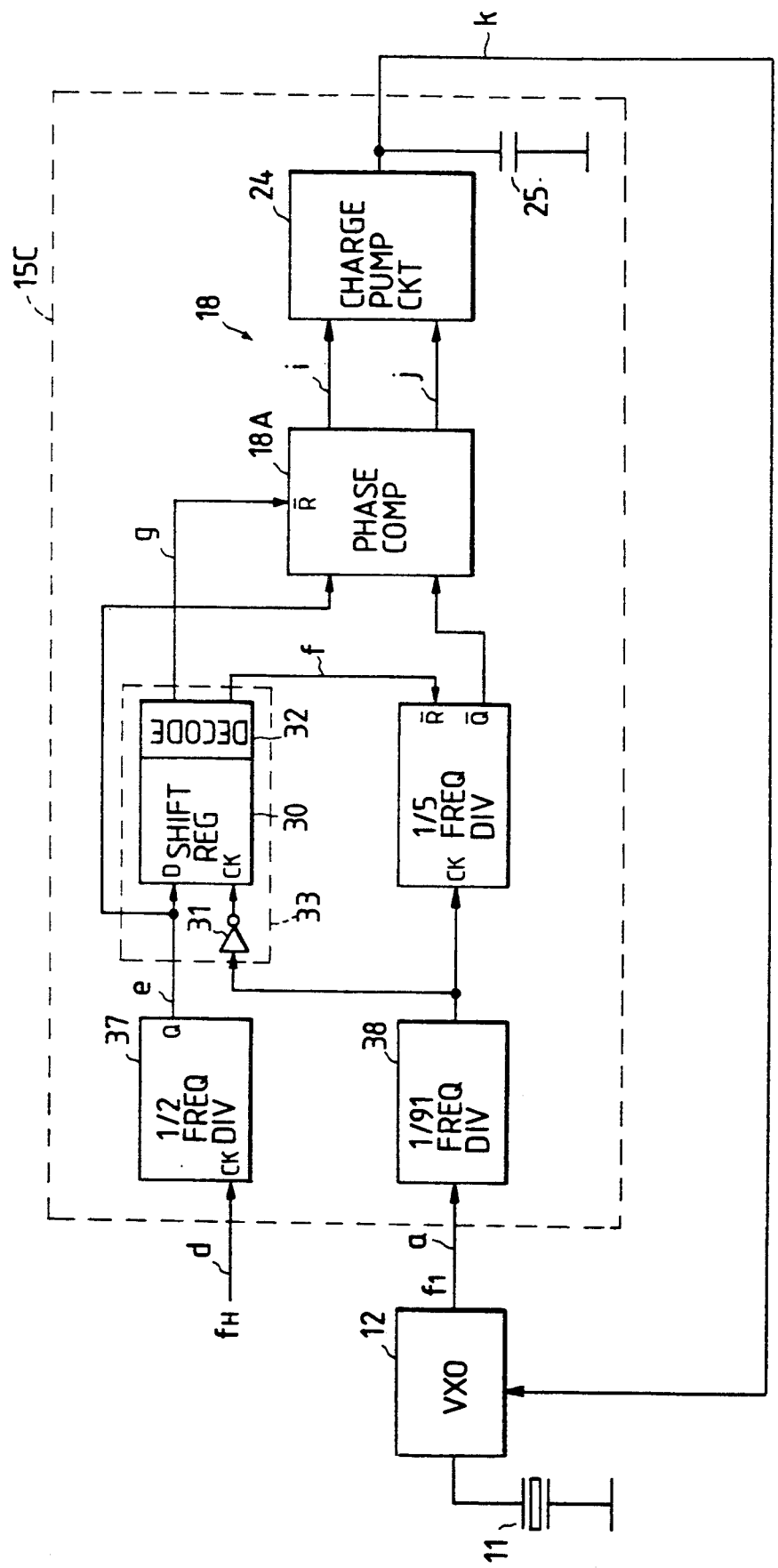
FIG. 8 is a block diagram of an fH lock circuit in a video signal processing apparatus according to a fourth embodiment of this invention.

FIG. 8 shows a part of a fourth embodiment of this invention which is similar to the embodiment of FIG. 7 except for design changes indicated later. The previously-mentioned equation (12) is rewritten into the following form.

$$f1/455 = fH/2 \qquad (15).$$

The fourth embodiment uses the equation (15).

In an fH lock circuit 15C of the embodiment of FIG. 8, a ½ frequency divider 37 and a 1/91 frequency divider 38 are used in place of the 1/4 frequency divider 19 and the 1/182 frequency divider 36 (see FIG. 7) respectively. The ¼ frequency divider 37 divides the frequency of a horizontal sync signal fH by 2. Thus, an output signal "e" from the ¼ frequency divider 37 has a frequency represented as "fH/2". The 1/91 frequency divider 38 divides the frequency of an output signal f1 from a voltage-controlled oscillator 12 by 91. Accordingly, an output signal "h" from a 1/5 frequency divider 35 has a frequency represented as "f1/455". As a result, the phase-locked loop of FIG. 8 operates to lock the phase of the signal "h" to the phase of the signal "e" and to enable the previously-mentioned frequency relation (15) between the signals f1 and fH to be satisfied.

The fH lock circuit 15C of FIG. 8 produces advantages similar to the advantages of the fH lock circuit 15A of FIG. 5.

What is claimed is:

1. A video signal processing apparatus comprising:
   a phase-locked loop including a quartz resonator, a voltage-controlled oscillator connected to the quartz resonator and oscillating at an oscillation frequency whose fundamental value is determined by the quartz resonator, and a horizontal sync signal lock circuit comparing a phase of a horizontal sync signal and a phase of an output signal from the voltage-controlled oscillator and controlling the oscillation frequency of the voltage-controlled oscillator in response to a difference between the phases of the horizontal sync signal and the output signal from the voltage-controller oscillator; and
   means for modulating the output signal from the voltage-controlled oscillator with a video signal;
   wherein the modulating means comprises:
   an encoder balanced-modulating the output signal from the voltage-controlled oscillator with a color difference signal of the video signal;
   means for generating a frequency-multiple signal which agrees with a frequency-multiple of the horizontal sync signal;
   a sub balanced modulator balanced-modulating the frequency-multiple signal with the output signal from the voltage-controlled oscillator; and
   a main balanced modulator balanced-modulating an output signal from the sub balanced modulator with an output signal from the encoder.

2. The video signal processing apparatus of claim 1 wherein the horizontal sync signal lock circuit comprises:
   a clock thinning circuit thinning out predetermined clock pulses from the output signal of the voltage-controlled oscillator;
   a 1/1135 frequency divider dividing a frequency of an output signal from the clock thinning circuit by 1135;
   a ¼ frequency divider dividing a frequency of the horizontal sync signal by 4; and
   means for comparing a phase of an output signal from the 1/1135 frequency divider and a phase of an output signal from the ¼ frequency divider, and for controlling the oscillation frequency of the voltage-controlled oscillator in response to a difference between the phases of the output signals from the 1/1135 frequency divider and the ¼ frequency divider.

3. The video signal processing apparatus of claim 2 wherein the horizontal sync signal lock circuit comprises:
   a 1/227 frequency divider dividing the frequency of the output signal from the clock thinning circuit by 227;
   a delay circuit using an output signal from the 1/227 frequency divider as a clock signal and delaying the output signal from the ¼ frequency divider by a first interval to generate a first reset signal;
   a 1/5 frequency divider being periodically reset by the first reset signal and dividing a frequency of the output signal from the 1/227 frequency divider by 5; and
   a phase comparator comparing the phase of the output signal from the ¼ frequency divider and a phase of an output signal from the 1/5 frequency divider and generating an output signal which depends on a difference between the phases of the output signals from the ¼ frequency divider and the 1/5 frequency divider.

4. The video signal processing apparatus of claim 3 wherein the delay circuit generates a second reset signal which is delayed from the first reset signal by a second interval, and the phase comparator is periodically reset by the second reset signal.

5. The video signal processing apparatus of claim 1 wherein the horizontal sync signal lock circuit comprises:
   a 1/910 frequency divider dividing a frequency of the output signal from the voltage-controlled oscillator by 910;
   a ¼ frequency divider dividing a frequency of the horizontal sync signal by 4; and
   means for comparing a phase of an output signal from the 1/910 frequency divider and a phase of an output signal from the ¼ frequency divider, and for controlling the oscillation frequency of the voltage-controlled oscillator in response to a difference between the phases of the output signals from the 1/910 frequency divider and the ¼ frequency divider.

6. The video signal processing apparatus of claim 5 wherein the horizontal sync signal lock circuit comprises:
   a 1/182 frequency divider dividing the frequency of the output signal from the voltage-controlled oscillator by 182;
   a delay circuit using an output signal from the 1/182 frequency divider as a clock signal and delaying the output signal from the ¼ frequency divider by a first interval to generate a first reset signal;
   a 1/5 frequency divider being periodically reset by the first reset signal and dividing a frequency of the output signal from the 1/182 frequency divider by 5; and
   a phase comparator comparing the phase of the output signal from the ¼ frequency divider and a phase of an output signal from the 1/5 frequency divider and generating an output signal which depends on a difference between the phases of the output signals from the ¼ frequency divider and the 1/5 frequency divider.

7. The video signal processing apparatus of claim 6 wherein the delay circuit generates a second reset signal which is delayed from the first reset signal by a second interval, and the phase comparator is periodically reset by the second reset signal.

8. The video signal processing apparatus of claim 1 wherein the horizontal sync signal lock circuit comprises:

a 1/455 frequency divider dividing a frequency of the output signal from the voltage-controlled oscillator by 455;

a ¼ frequency divider dividing a frequency of the horizontal sync signal by 4; and means for comparing a phase of an output signal from the 1/455 frequency divider and a phase of an output signal from the ¼ frequency divider, and for controlling the oscillation frequency of the voltage-controlled oscillator in response to a difference between the phases of the output signals from the 1/455 frequency divider and the ¼ frequency divider.

9. The video signal processing apparatus of claim 8 wherein the horizontal sync signal lock circuit comprises:

a 1/91 frequency divider dividing the frequency of the output signal from the voltage-controlled oscillator by 91;

a delay circuit using an output signal from the 1/91 frequency divider as a clock signal and delaying the output signal from the ¼ frequency divider by a first interval to generate a first reset signal;

a 1/5 frequency divider being periodically reset by the first reset signal and dividing a frequency of the output signal from the 1/91 frequency divider by 5; and a phase comparator comparing the phase of the output signal from the ¼ frequency divider and a phase of an output signal from the 1/5 frequency divider and generating an output signal which depends on a difference between the phases of the output signals from the ¼ frequency divider and the 1/5 frequency divider.

10. The video signal processing apparatus of claim 9 wherein the delay circuit generates a second reset signal which is delayed from the first reset signal by a second interval, and the phase comparator is periodically reset by the second reset signal.

11. An apparatus comprising:

a voltage-controller oscillator;

a clock thinning circuit thinning out predetermined clock pulses from an output signal of the voltage-controlled oscillator;

a 1/1135 frequency divider dividing a frequency of an output signal from the clock thinning circuit by 1135;

a ¼ frequency divider dividing a frequency of a horizontal sync signal be 4; and means for comparing a phase of an output signal from the 1/1135 frequency divider and a phase of an output signal from the ¼ frequency divider, and for controlling an oscillation frequency of the voltage-controlled oscillator in response to a difference between the phases of the output signals from the 1/1135 frequency divider and the ¼ frequency divider.

12. The apparatus of claim 11 comprising:

a 1/227 frequency divider dividing the frequency of the output signal from the clock thinning circuit by 227;

a delay circuit using an output signal from the 1/227 frequency divider as a clock signal and delaying the output signal from the ¼ frequency divider by a first interval to generate a first reset signal;

a 1/5 frequency divider being periodically reset by the first reset signal and dividing a frequency of the output signal from the 1/227 frequency divider by 5; and a phase comparator comparing the phase of the output signal from the ¼ frequency divider and a phase of an output signal from the 1/5 frequency divider and generating an output signal which depends on a difference between the phases of the output signals from the ¼ frequency divider and the 1/5 frequency divider.

13. The apparatus of claim 12 wherein the delay circuit generates a second reset signal which is delayed from the first reset signal by a second interval, and the phase comparator is periodically reset by the second reset signal.

14. An apparatus comprising:

a voltage-controller oscillator;

a 1/910 frequency divider dividing a frequency of an output signal from the voltage-controlled oscillator by 910;

a ¼ frequency divider dividing a frequency of a horizontal sync signal by 4; and means for comparing a phase of an output signal from the 1/910 frequency divider and a phase of an output signal from the ¼ frequency divider, and for controlling an oscillation frequency of the voltage-controlled oscillator in response to a difference between the phases of the output signals from the 1/910 frequency divider and the ¼ frequency divider.

15. The apparatus of claim 14 comprising:

a 1/182 frequency divider dividing the frequency of the output signal from the voltage-controlled oscillator by 182;

a delay circuit using an output signal from the 1/182 frequency divider as a clock signal and delaying the output signal from the ¼ frequency divider by a first interval to generate a first reset signal;

a 1/5 frequency divider being periodically reset by the first reset signal and dividing a frequency of the output signal from the 1/182 frequency divider 5; and a phase comparator comparing the phase of the output signal from the ¼ frequency divider and a phase of an output signal from the 1/5 frequency divider and generating an output signal which depends on a difference between the phases of the output signals from the ¼ frequency divider and the 1/5 frequency divider.

16. The apparatus of claim 15 wherein the delay circuit generates a second reset signal which is delayed from the first reset signal by a second interval, and the phase comparator is periodically reset by the second reset signal.

17. An apparatus comprising:

a voltage-controlled oscillator;

a 1/455 frequency divider dividing a frequency of an output signal from the voltage-controlled oscillator by 455;

a ¼ frequency divider dividing a frequency of a horizontal sync signal by 4; and means for comparing a phase of an output signal from the 1/455 frequency divider and a phase of an output signal from the ¼ frequency divider, and for controlling an oscillation frequency of the voltage-controlled oscillator in response to a difference between the phases of the output signals from the 1/455 frequency divider and the ¼ frequency divider.

18. The apparatus of claim 17 comprising:
a 1/91 frequency divider dividing the frequency of the output signal from the voltage-controlled oscillator by 91;
a delay circuit using an output signal from the 1/91 frequency divider as a clock signal and delaying the output signal from the ½ frequency divider by a first interval to generate a first reset signal;
a 1/5 frequency divider being periodically reset by the first reset signal and dividing a frequency of the output signal from the 1/91 frequency divider by 5; and
a phase comparator comparing the phase of the output signal from the ½ frequency divider and a phase of an output signal from the 1/5 frequency divider and generating an output signal which depends on a difference between the phases of the output signals from the ½ frequency divider and the 1/5 frequency divider.

19. The apparatus of claim 18 wherein the delay circuit generates a second reset signal which is delayed from the first reset signal by a second interval, and the phase comparator is periodically reset by the second reset signal.

20. A video signal processing apparatus comprising:
means for generating a subcarrier signal;
a modulator modulating the subcarrier signal with a video signal;
means for generating a fixed-frequency signal;
a first mixer mixing the subcarrier signal and the fixed-frequency signal;
a second mixer mixing an output signal from the modulator and an output signal from the first mixer.

* * * * *